(12) United States Patent
Ishikawa et al.

(10) Patent No.: US 7,021,323 B1
(45) Date of Patent: Apr. 4, 2006

(54) DUST-INCOMPATIBLE ARTICLE TRANSFER CONTAINER CLEANER

(75) Inventors: Toshio Ishikawa, Tokyo (JP); Koji Ohyama, Tokyo (JP)

(73) Assignee: Dainichi Shoji Kabushiki Kaisha, (JP)

( * ) Notice: Subject to any disclaimer, the term of this patent is extended or adjusted under 35 U.S.C. 154(b) by 511 days.

(21) Appl. No.: 10/296,437

(22) PCT Filed: Jun. 1, 2000

(86) PCT No.: PCT/JP00/03551

§ 371 (c)(1),
(2), (4) Date: Nov. 22, 2002

(87) PCT Pub. No.: WO01/91928

PCT Pub. Date: Dec. 6, 2001

(51) Int. Cl.
*B08B 3/02* (2006.01)

(52) U.S. Cl. ............................. 134/166 R; 134/169 R; 134/170; 134/102.1; 134/102.3; 134/902

(58) Field of Classification Search ............ 134/166 R, 134/169 R, 170, 200, 102.1, 102.3, 902
See application file for complete search history.

(56) References Cited

U.S. PATENT DOCUMENTS

| | | | |
|---|---|---|---|
| 4,746,034 A | | 5/1988 | Ata et al. |
| 5,238,503 A | * | 8/1993 | Phenix et al. .................. 134/37 |
| 5,301,700 A | * | 4/1994 | Kamikawa et al. ............ 134/76 |
| 5,363,867 A | * | 11/1994 | Kawano et al. ............. 134/95.2 |
| 5,778,740 A | | 7/1998 | Tye |
| 5,991,965 A | * | 11/1999 | Stroh et al. .................... 15/310 |
| 6,202,318 B1 | * | 3/2001 | Guldi et al. .................... 34/79 |
| 6,267,123 B1 | * | 7/2001 | Yoshikawa et al. ............ 134/62 |
| 6,322,633 B1 | * | 11/2001 | Bexten et al. .................. 134/1 |
| 6,358,328 B1 | * | 3/2002 | Yang et al. .................... 134/21 |
| 6,616,770 B1 | * | 9/2003 | Musha et al. .................. 134/10 |
| 2002/0026953 A1 | * | 3/2002 | Musha et al. .................. 134/10 |
| 2002/0046760 A1 | * | 4/2002 | Halbmaier .............. 134/167 R |

FOREIGN PATENT DOCUMENTS

| | | | |
|---|---|---|---|
| JP | 2-122629 | * | 5/1990 |
| JP | 3-270016 | * | 12/1991 |
| JP | 04-004082 | | 1/1992 |
| JP | 6-120186 | * | 4/1994 |
| JP | 10-214811 | | 8/1998 |
| JP | 11-047710 | | 2/1999 |
| JP | 11-283947 | | 10/1999 |
| WO | WO 94/14191 | * | 6/1994 |

OTHER PUBLICATIONS

International Search Report.

* cited by examiner

*Primary Examiner*—Frankie L. Stinson
(74) *Attorney, Agent, or Firm*—Cantor Colburn LLP

(57) ABSTRACT

To clean the inside and outside of a container capable of containing dust-free objects for carrying, a cleaning apparatus is used within a clean room or a housing in which the cleaning apparatus is installed. The clean room or housing is kept highly cleaned. By the cleaning apparatus, the container is separated into a container body and a lid, the separated container body and lid are subject to cleaning conducted by cleaning means. Coupling means allows the cleaned container body and lid to be coupled again into the container. This coupling operation is performed automatically, the inside of the container that has already been cleaned will not be spoiled in its clean level.

9 Claims, 15 Drawing Sheets

(A)

(B)

(A)

(B)

(G)

(H)

(I)

(J)

(K)

(L)

(M)

(N)

(O)

(P)

(Q)

(R)

DUST-INCOMPATIBLE ARTICLE TRANSFER CONTAINER CLEANER

FIELD OF THE ART

The present invention relates to an apparatus to wash the outside and inside of a container that contains objects, such as substrates, which should be kept at a high clean level during their carriage. Although the following explanation will be given on condition that the objects are composed of such semiconductor substrates as silicon wafers and liquid crystal substrates, in particular, semiconductor wafers, those are just exemplified lists, do not mean to limit the scope of the present invention. The present invention will therefore be applicable to any objects, as long as it is required that they be kept at a high clean level during the carriage.

BACKGROUND ART

Semiconductor substrates, particularly, semiconductor wafers, will be contaminated if dusts, vaporized organic substances, or others (hereafter simply referred to as "dusts") adhere to those substrates. This contamination will have influence on the manufacture, such that in particular, a yield ratio, or a rate of non-defectives in manufacturing those substrates is reduced. Accordingly, carrying semiconductor wafers requires that the surroundings thereof be high in a clean level. This means that semiconductor wafers can be categorized into one of the objects (hereinafter referred to as a dust-free object) of which clean levels should be kept high during the carriage.

In general, semiconductor wafers are processed in what is called a clean room, which is a room cleaned at a higher level (hereafter referred to as a "high clean room"). In contrast, in cases where semiconductor wafers should be delivered in a room or others whose clean levels are lower, the wafers are contained in a highly cleaned airtight container (hereafter referred to as a "container"), and the container itself is carried. This delivery enables semiconductor wafers to be carried by way of a room or an outside environment that is lower in the clean level room (hereafter referred to as a "lower-clean-level room"), with the wafers unpolluted by dusts during their carriage.

A loader having an aperture that can be closed is arranged at a boundary between a high clean room and a lower-clean-level room. The loader is used not only for carrying in semiconductor wafers from the highly cleaned space in a container to a highly cleaned room for processing the wafers (hereafter referred to as "loading"). The loader is also used for carrying out the semiconductor wafers from the highly cleaned room to the highly cleaned space in the container in order to deliver the processed wafers to another step (hereafter referred to as "unloading").

For loading or unloading semiconductor wafers, the wafers are carried in or out through the aperture of the loader. The container is equipped with a lid so as to be located at the aperture of the loader, so that the lid is taken off when semiconductor wafers are carried in or out.

As standards for such containers and loaders, proposed and employed are SEMI (Semiconductor Equipment and Material International) standard E47.1 "Box/Pod (FOUP)," E15.1 "Tool Load Port," E57 "Kinematic Coupling," E62 "Front-Opening Interface Standard (FIMS)," E63 "Box/Opener to Tool Standard (BOLTS)," (hereinafter referred as "the standards").

PRIOR ART

It is required that the foregoing container be cleaned at regular intervals, because it is inevitable that dusts adhere to both the inside and outside of the container during use. In cases a conventional cleaning apparatus is used for cleaning the container, a worker first opens a door unit of a housing of the cleaning apparatus to place into the housing both of the container body and the lid which have been separated by the operator by hand. The door unit is then closed and a switch is turned on which instructs a cleaning unit disposed within the housing of spraying water to wash both the container body and the lid. This washing is followed by a dry step carried out by spaying air onto the container body and lid. After completing the dry step, the operator again opens up the door unit to take out both of the container body and the lid, and then couples both of them with each other by hand.

However, if such cleaning apparatus is used in, for example, the foregoing lower-clean-level room, the second opening operation of the door unit carried out by the worker will cause contaminated air accumulated in the lower-clean-level room to enter into the housing. This results in that the outside and inside of the mutually separated container unit and lid are again contaminated. The contamination will last until the container body is coupled with its lid by hand. Accordingly, the inside of the container, which has been cleaned once, is spoiled in the clean level again.

Even if the foregoing cleaning apparatus is used in the highly cleaned room, this cleaning entails the worker's entering into the room for the separation and coupling of the container body and lid. This entering work should cause dusts adhering on the worker to be brought into the room, so that the highly cleaned room itself will be contaminated. It is general that various semiconductor-processing apparatuses are located in the highly cleaned room with less waste in arrangement space for automatic operations of such apparatuses. This means that there is no space left for the worker in the room, even if the worker wants to manually operate the apparatuses.

When the cleaning apparatus is installed in the highly cleaned room, it is therefore necessary to convey the container with a robot such as an AGV (transporting robot). It is required for the cleaning apparatus to have an automation mechanism to be transported by the robot.

The present invention has been made to solve the foregoing problems, and an object of the present invention is to provide a cleaning apparatus, which is able to clean the container for carrying dust-free objects contained therein such that; in cases where the cleaning is carried out in the lower-clean-level room, setting the container into the cleaning apparatus through worker's manual operations or robot's operations will not spoil a clean level of the inside of the container placed within the cleaning apparatus, while in cases where the cleaning is carried out in the highly cleaned room, the contamination of the room attributable to contaminants such as dusts adhering to a worker is eliminated so that both of the outside and inside of the container is kept clean.

DISCLOSURE OF THE INVENTION

In order to attain the above object, the present invention is configured as follows.

A first invention is a cleaning apparatus for cleaning an inside and outside of a container containing a dust-free object for carrying, the apparatus comprising:

(a) separating means for separating the container into a container body and a lid;
(b) cleaning means for cleaning the separated container body and lid; and
(c) coupling means for coupling again the cleaned container body and lid.

The present invention permits the cleaned container body and lid to be automatically re-coupled to each other. It is therefore unnecessary for a worker to mutually couple the cleaned container body and lid by hand, resulting in that the inside of the container, which has been cleaned already, will not spoiled in clean level. Accordingly, there is no need to prepare a purifying system dedicated to purification work, such as prior removal of contaminants (e.g., dusts) from a worker who would be engaged in the coupling work.

A second invention is a cleaning apparatus wherein which each of the separating, cleaning, and coupling means is disposed within a clean room kept at a higher clean level.

The present invention causes the separated and cleaned container body and lid to be re-coupled automatically to each other in a highly cleaned air. Thus, there is no necessity of exposing both of the container body and the lid to a lower-clean-level air. In addition, this configuration eliminates the necessity of making a worker enter the clean room to perform the coupling operation.

A third invention is a cleaning apparatus wherein each of the separating, cleaning, and coupling means is disposed within a housing equipped with an openable and closable carrying-out/in opening for carrying out or in the container and kept at a higher clean level.

The present invention enables the separated and cleaned container body and lid to be re-coupled automatically to each other in a highly cleaned air within the housing. Hence even if this cleaning apparatus is placed in a lower-clean-level room, both of the container body and the lid will not be exposed to the air in the lower-clean-level room. It is therefore avoided that the inside of the container, which has been cleaned already, will not be degraded concerning its clean level.

A fourth invention is concerned with a cleaning apparatus that comprises the cleaning means having container-body cleaning means and lid cleaning means disposed separately from each other, wherein each of both the cleaning means is installed in individual cleaning booths partitioned within the housing, and carrying means for carrying the separated container body or the separated lid to each of the cleaning booths as well as from each of the cleaning booths after the cleaning.

The present invention makes it possible that both of the container body and the lid are cleaned in parallel, so that the entire cleaning operation can be done more faster.

A fifth invention is a cleaning apparatus wherein the cleaning means uses either one means or a plurality of means selected from a group of means of spraying gas, spraying a chemical, spraying water, and rotating a brush, the plurality of selected means being combined with each other.

A sixth invention is a cleaning apparatus in which the cleaning means is composed of means for spraying water, and the apparatus further comprising dry means that perform a drying action after the cleaning.

A seventh invention is a cleaning apparatus for cleaning an inside and outside of a container containing a dust-free object for carrying, the apparatus comprising:
(a) a housing having a plurality of partitioned booths closable in a shielded manner which are kept in a higher clean level;
(b) a carrying-in opening through which the container is carried in the housing and a carrying-out opening through which the container is carried out from the housing, the carrying-in and carrying-out openings being formed through a wall of the housing;
(c) opening and closing shutters arranged at the carrying-in and carrying-out openings, respectively;
(d) loaders or unloaders for locating the container, the loaders or unloaders being disposed on an outside of both the carrying-in and carrying-out openings, respectively;
(e) outer-surface cleaning means, which is disposed in a separation booth located on an inner side of the carrying-in opening, for cleaning an outer surface of the container before being separated and separation means for separating the container into a container body and a lid;
(f) container-body cleaning means disposed in a container-body cleaning booth next to the separation booth;
(g) container-body drying means disposed in a container-body drying booth next to the container-body cleaning booth;
(h) coupling means for re-coupling both of the container body and the lid to each other, the coupling means being disposed in a coupling booth next to the container-body drying booth and directly leading to the carrying-out opening;
(i) container-body carrying means for carrying the container body from the loader, the separation booth, the container-body cleaning booth, the container-body drying booth, and to the coupling booth;
(j) lid cleaning means and lid drying means both disposed in a lid cleaning booth next to the separation booth; and
(k) lid carrying means for carrying the lid, together with the separation means that is engaged in the separation, from the separation booth, the lid cleaning booth, and to the coupling booth.

BRIEF DESCRIPTION OF THE DRAWINGS

In the accompanying drawings.

DETAILS OF THE INVENTION

Figure 1:
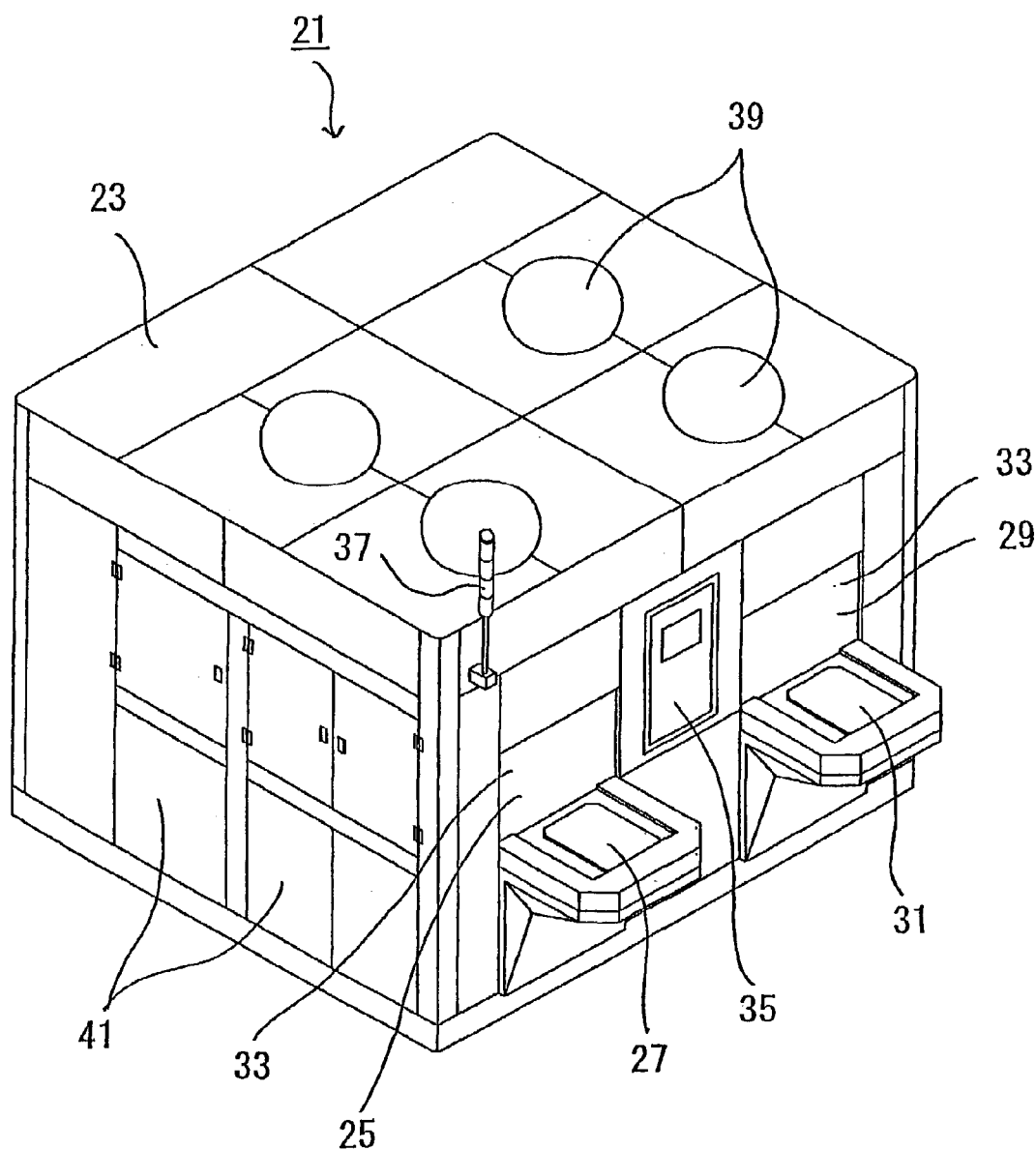
FIG. 1 is an entire perspective view of a container cleaning apparatus according to one embodiment of the present invention.
Figure 2:
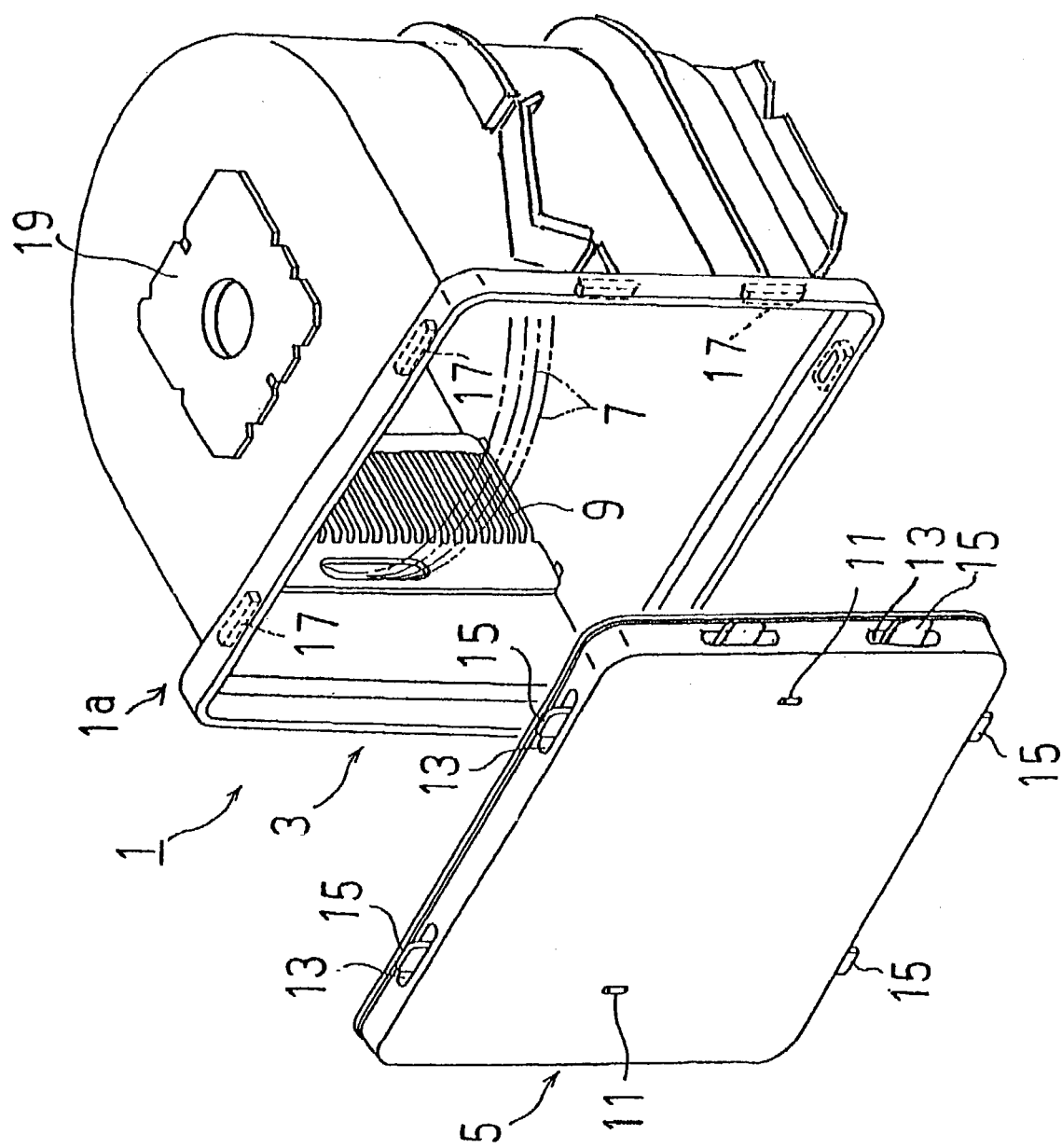
FIG. 2 is an perspective view showing a container with its lid separated, which is cleaned by the container cleaning apparatus shown in FIG. 1.

Referring to FIGS. 1 to 15, an example of a best mode of embodiments of the present invention will now be described. It should be mentioned that the following embodiment does not mean to limit the scope of the present invention, but it is possible for the skilled person in the art to adopt other various configurations within the principle of the present invention.

(Example of Container)

A container cleaned according to the principle of the present invention is configured such that the container is separated into a container body and a lid. As long as this configuration is held, the shape and other factors of the container are not limited to particular ones. In the present embodiment, the container is exemplified as to a type called "FOUP," which will be described based on FIG. 2.

A container 1 is provided as shown therein, where at the front of the container 1 is formed an opening 3 that can be opened and closed by a lid 5. Members referred to as teeth 9 are provided on an inner wall of the container 1 for the purpose of containing a plurality of semiconductor wafers 7, which are one of dust-free objects. The teeth 9 are in charge of sustaining the plurality of semiconductor wafers 7 in horizontal and mutually parallel attitudes.

At particular positions of a surface of the lid 5, there are formed key holes 11 on which an opener mechanism of a loader acts. To be specific, the opener mechanism has keys to be inserted into the key holes 11 to be rotated, so that locking mechanisms arranged within the lid 5 are driven. This driving operation causes four locking claws 15, which are protruded from windows 13 of sides of the lid 5 at four locations, to pull back, thereby being unlocked from engaging members 17 arranged at particular positions of edges of the opening 3, thereby being released from the engagement. Thus, the lid 5 can finally be separated from the opening 3 of the container 1.

Mechanisms similar in construction to the opener mechanism are adapted to separation means and coupling means later described. Such similar mechanisms also allow the lid 5 to be coupled and operated, where the key holes 11, locking claws 15, engaging members 17, and locking mechanisms of the container 1 are used without any changes given to their constructions.

On an upper surface of the container is provided a gripper 19 to be gripped during the delivery carried out by a robot or others. Further, on a bottom of the container 1 are formed three pin grooves (not shown), which are necessary for kinematics coupling used for positioning for loadeding and unloading. The pin grooves are formed to extend from the center of the bottom in radial directions. Three pins (not shown) that engage with these pin grooves are disposed in the loader and unloader.

(Outside of Cleaning Apparatus)

Figure 3:
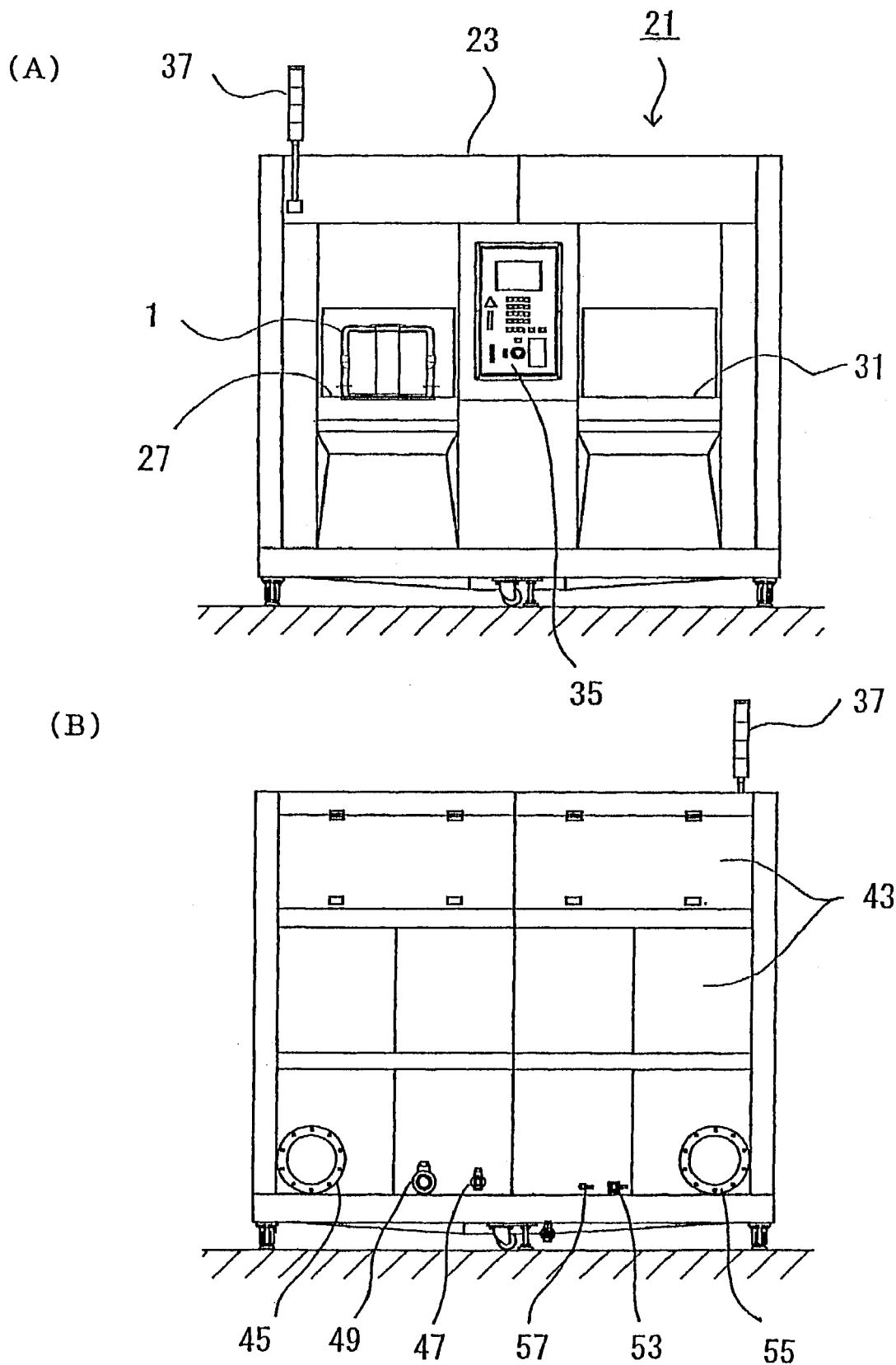
FIG. 3(A) is the front view of the container cleaning apparatus shown in FIG. 1.
FIG. 3(B) is the rear view of the container cleaning apparatus shown in FIG. 1.
Figure 4:
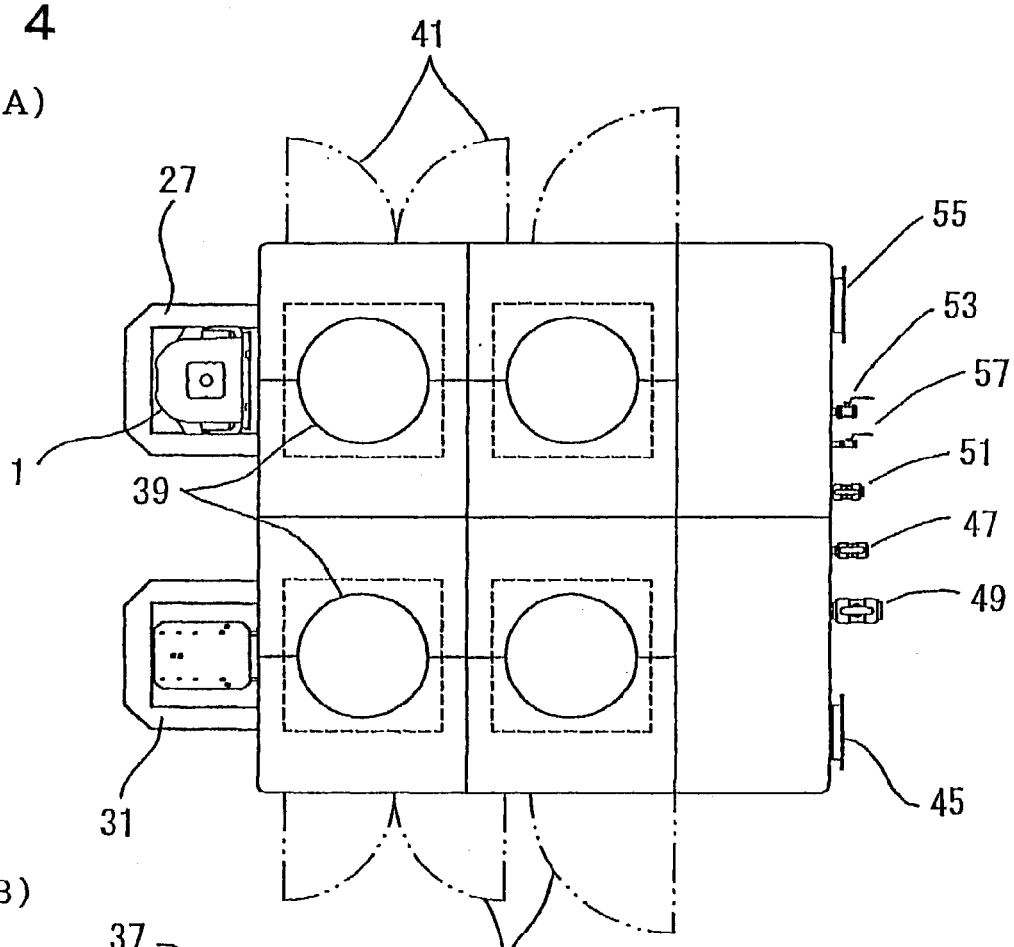
FIG. 4(A) is the plan view of the container cleaning apparatus shown in FIG. 1.
FIG. 4(B) is the right side view of the container cleaning apparatus shown in FIG. 1.
Figure 4:
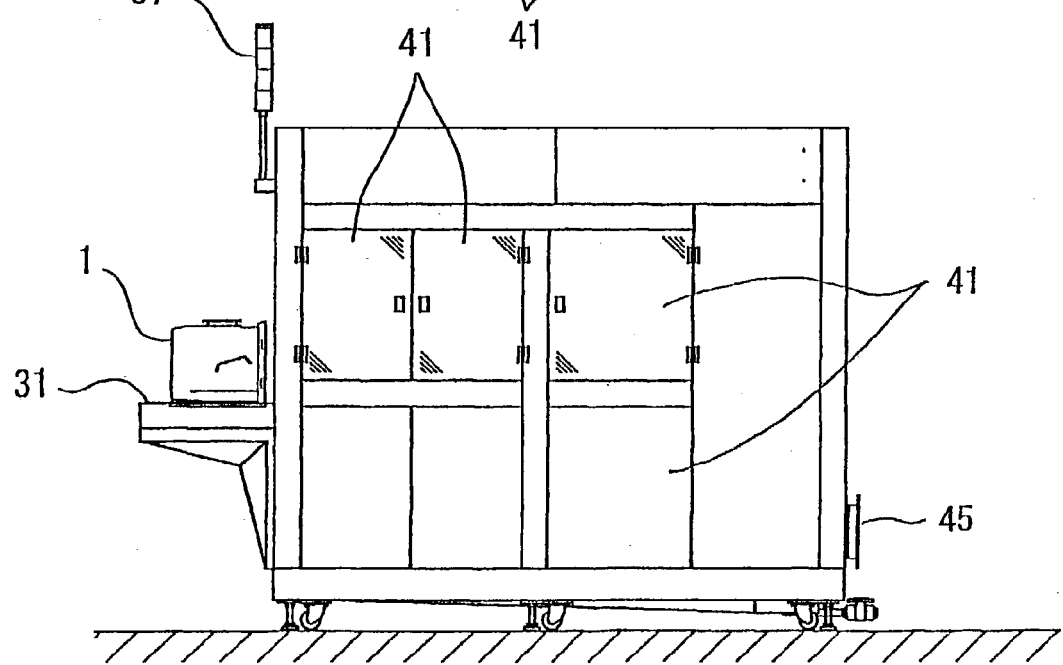

As shown in FIGS. 1, 3 and 4, a cleaning apparatus 21 is equipped with an entirely box-shaped housing 23. In a left part of a front of the housing 23, a carrying-in opening 25 and a loader 27 are disposed for carrying in the container 1 to be cleaned, while in a right part of the front thereof, a carrying-out opening 29 and an unloader 31 are disposed for carrying out the container 1 that has been cleaned. Each of the carrying-in and carrying-out openings 25 and 29 is provided with an opening/closing shutter 33. In addition, each of the loader 27 and unloader 31 is provided with three pins (not shown) responsible for kinematics coupling for positioning to the container 1. The three pins can be engaged with the thee pin grooves formed on the bottom of the container 1. Once the container 1 has been positioned, the container 1 is automatically carried into or from the housing 23 with the aid of a carrying-in unit 27a installed in a lower part of the loader 27 or a carrying-out unit 31a installed in a lower part of the unloader 31.

In a central part of the front of the housing 23, a control panel 35 is placed for use of controlling the cleaning apparatus 21. A display lamp 37 is provided on the front thereof in order to show the operation states of the cleaning apparatus 21. Though the top of the housing 23, there are provided clean-fan intaking ports 39 to take the air into the inside, where the air that has been taken in is obliged to pass an air filter to keep the inside of the housing 23 at a higher clean level. Openable/closable panels 41 and 43 are arranged at specified positions of sides and the rear of the housing 23 for maintenance or others.

At specified positions of the rear of the housing 23 are provided an exhaust air duct 45 for exhausting the air taken in by way of the clean-fan blowing ports 39; pure-water supply port 47 to supply pure water used for cleaning; drain port 49 in charge of draining the water used for the cleaning; apparatus drain 51 for draining water coming from cleaning means; $N_2$ supply port 53 for supplying $N_2$ gas used in a drying process which follows the cleaning process; apparatus drain duct 55 for exhausting the $N_2$; and driving-air supply port 57 for driving some units such as a later-described carrying unit.

(Inside of Cleaning Apparatus)

(Outline)

Figure 5:
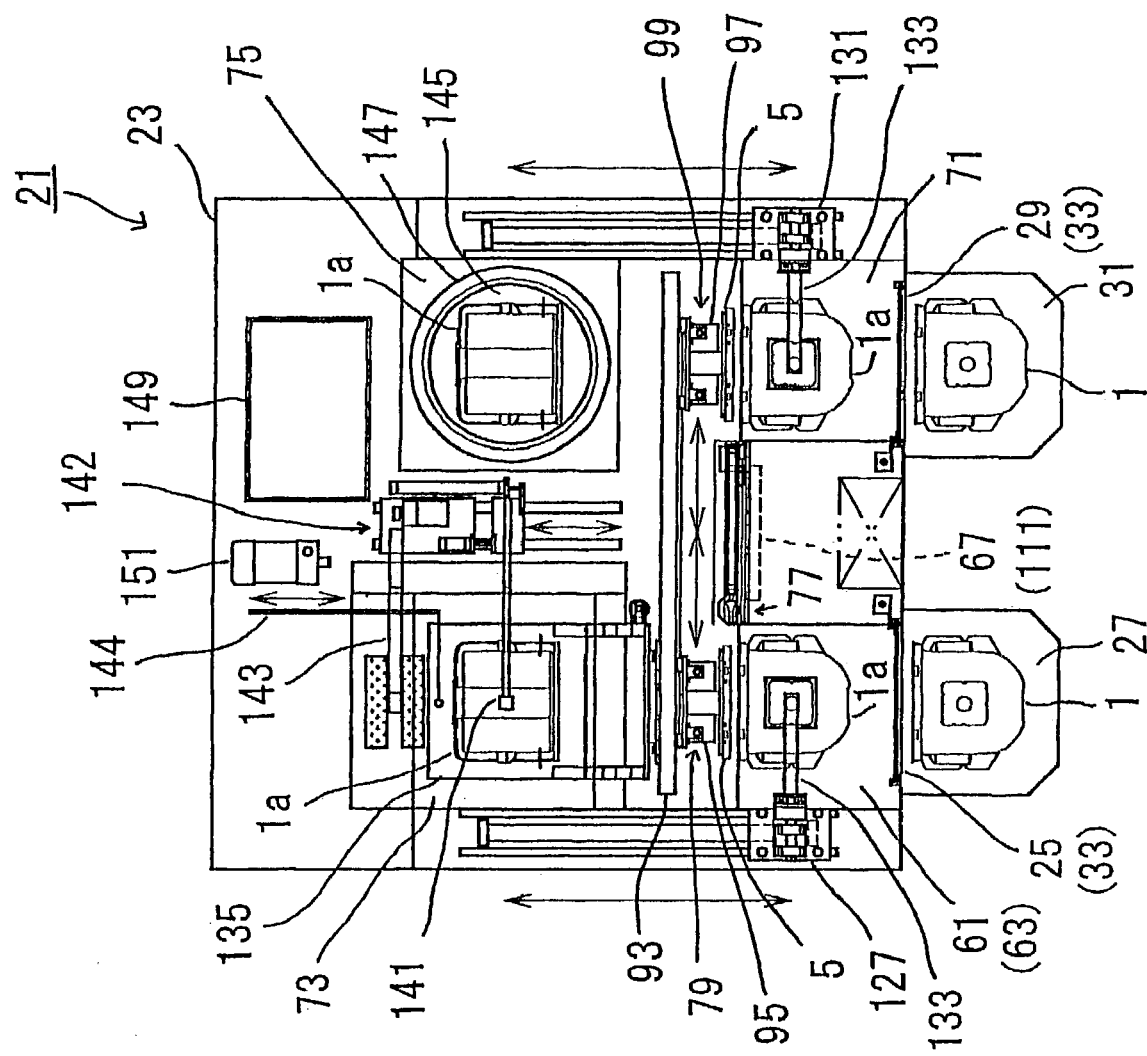
FIG. 5 is a horizontal cross section of the container cleaning apparatus shown in FIG. 1.
Figure 6:
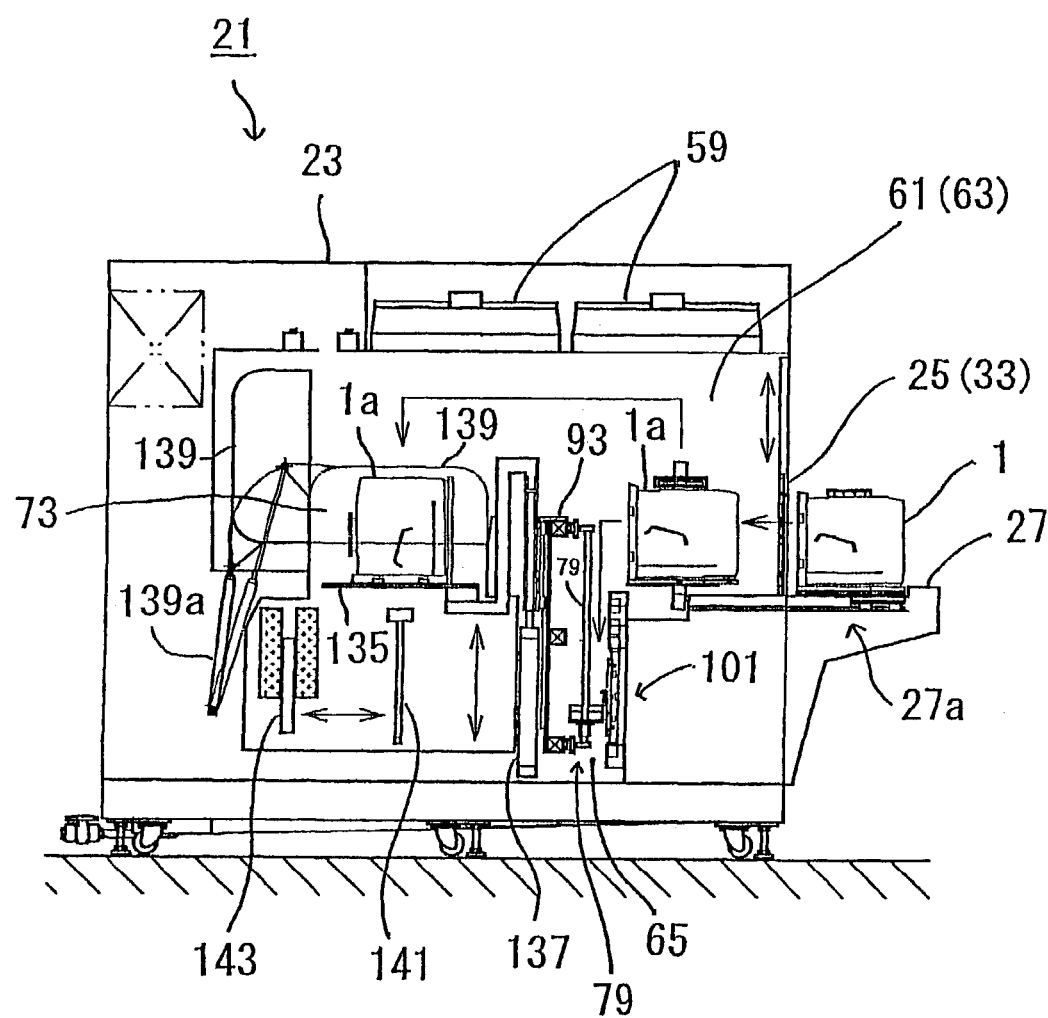
FIG. 6 is a left longitudinal cross section of the container cleaning apparatus shown in FIG. 1.
Figure 7:
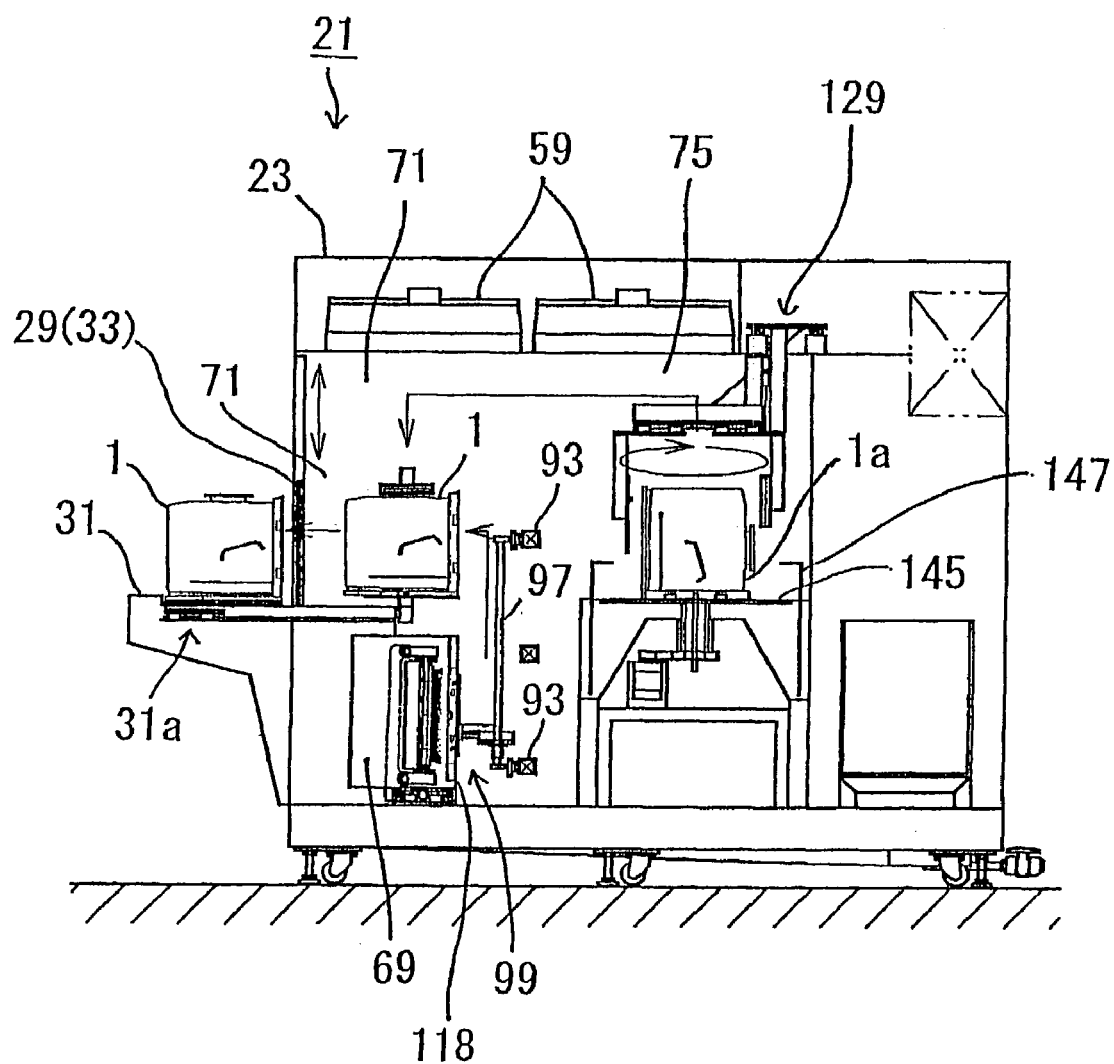
FIG. 7 is a right longitudinal cross section of the container cleaning apparatus shown in FIG. 1.
Figure 8:
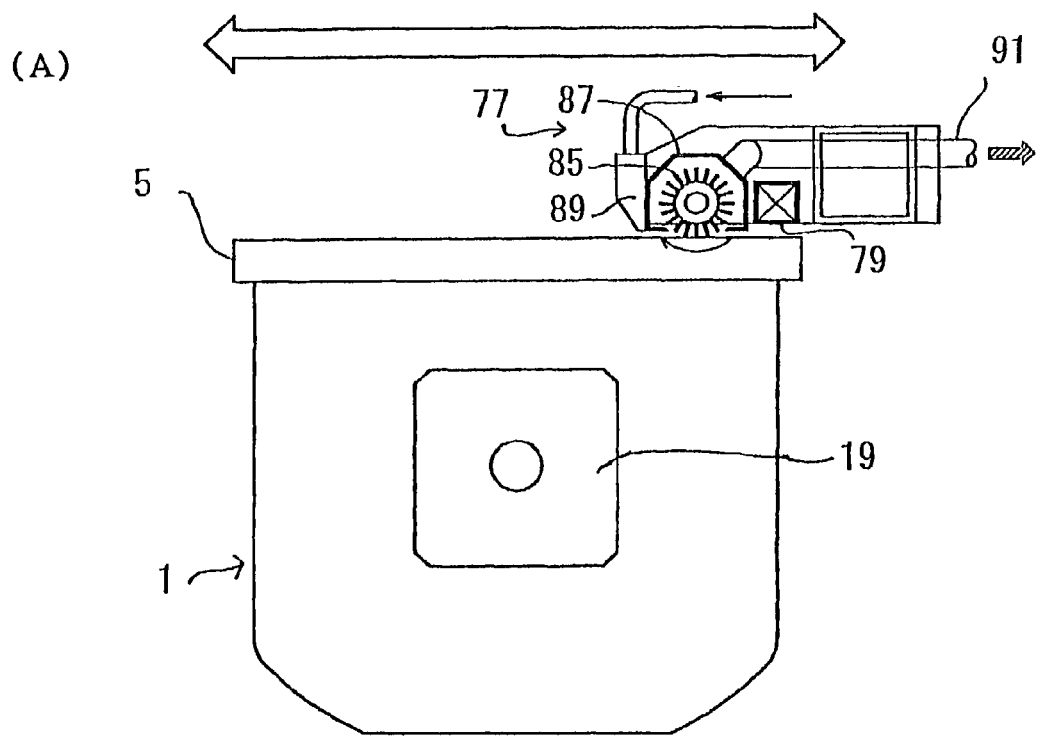
FIG. 8(A) is a plan view showing operations during which the outside of a lid coupled with the container is cleaned.
FIG. 8(B) is the font view of the container shown in FIG. 8(A)
Figure 8:
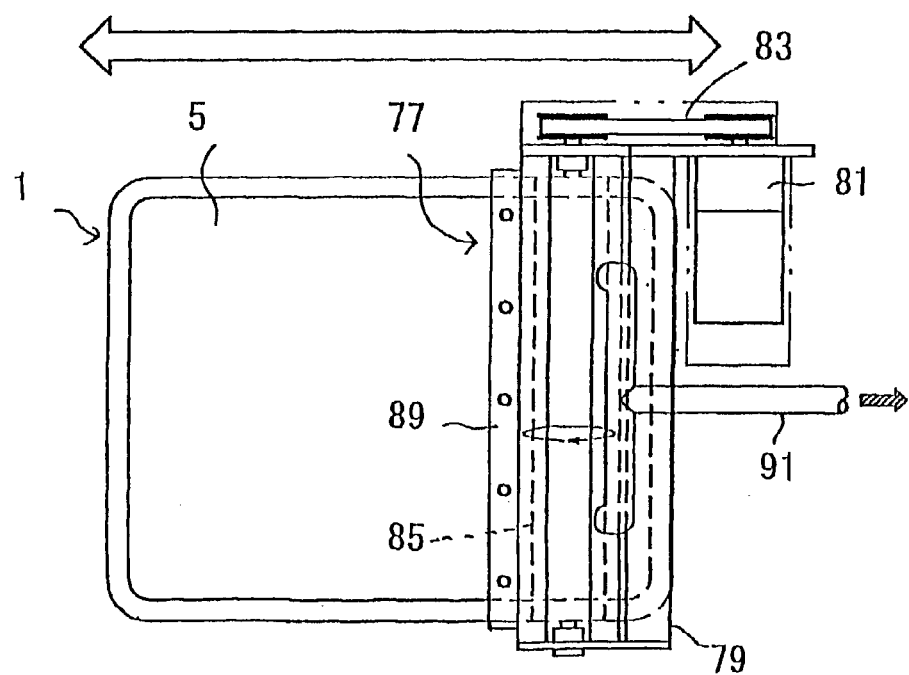

Referring to FIGS. 5, 6 and 7, an inside of the cleaning apparatus 21 will now be outlined.

The cleaning apparatus 21 has a ceiling, and at specified positions of the ceiling, there are provided clean fans 59 for blowing a highly cleaned air downward so that the inside of the housing 23 is kept at a higher clean level. The inside space of the housing 23 is partitioned into a plurality of booths used for cleaning steps, respectively. Practically, as shown in FIG. 5, a separation booth 63 used in common for a lid's outer-surface cleaning booth 61 is provided on the inside of the carrying-in opening 25. On the lower side of, but next to, the separation booth 63 is provided a lid's side cleaning booth 65 (refer to FIG. 6). On the central side of, but next to, the lid's side cleaning booth 65 is provided a lid's inside cleaning booth 67. On the frontward left side of, but next to, the lid's inside cleaning booth 67 is provided a lid's inner-surface cleaning booth 69 (refer to FIG. 7).

Furthermore, on the upper side, but next to, the lid's inner-surface cleaning booth 69 is provided a coupling booth 71.

Still, as shown in FIG. 5, a container-body cleaning booth 73 is provided on the rear side of, but next to, the separation booth 63. On the right side (when directly viewing the front of the housing) of, but next to, the container-body cleaning booth 73 is provided a container-body drying booth 75. Further, on the front side (when directly viewing the front of the housing) of, but next to, the container-body drying booth 75, the foregoing coupling booth 71 is located.

Each of the foregoing booths will now be detailed.

(Separation Booth Used in Common as Lid's Outer-Surface Cleaning Booth)

In the booth 61 (63), there are provided a lid's outer-surface cleaning unit 77 used for cleaning an outer surface of the lid 5 and a first lid opening/closing unit 79 serving as separation means.

Of these units, the lid's outer-surface cleaning unit 77 (refer to FIGS. 5 and 8) is coupled with an arm 79 slidable along a slide rail arranged horizontally in the lateral direction at a central position on the front side within the housing 23. The outer surface of the lid 5 of the container 5 is located in the lateral direction as well. The arm 79 supports a dry nylon brush 85 rotatable in response to a rotation drive force transmitted from a motor 81 through a belt 83. The dry nylon brush 85 has a rotation axis direction, the length of which is made to equal to a longitudinal length of the lid 5 (refer to FIG. 8(B)). The dry nylon brush 85 is covered by a brush cover 87, to which attached are an air nozzle 89, from which an ionizing air is sprayed, and an exhaust duct 91.

On the other hand, the first lid opening/closing unit 79 (refer to FIG. 5), which serves as separation means, is arranged with a horizontal rail 93. This rail 93 is bridged in the lateral direction over the three booths, i.e., the separation booth 63, the lid's inside cleaning booth 67 next to the right side of the separation booth 63 (when directly viewing the front of the housing), and the coupling booth 71. Longitudinal rails 95 are disposed on the horizontal rail 93 so that they are slidable in the horizontal direction along the horizontal rail 93. The foregoing first lid opening/closing unit 79 is therefore secured on the longitudinal rails 95 so that it is slidable upward or downward in the longitudinal direction along the longitudinal rails 95. In addition, second longitudinal rails 97 are secured on a right portion of this horizontal rail 93, and a second lid opening/closing unit 99 is secured on the second longitudinal rails 97 such that it is slidable upward and downward in the longitudinal direction. Incidentally, both of the first and second lid opening/closing units 79 and 99 are configured to support the lid 5 with the aid of vacuum pads.

(Lid's Side Cleaning Booth)

Figure 9:
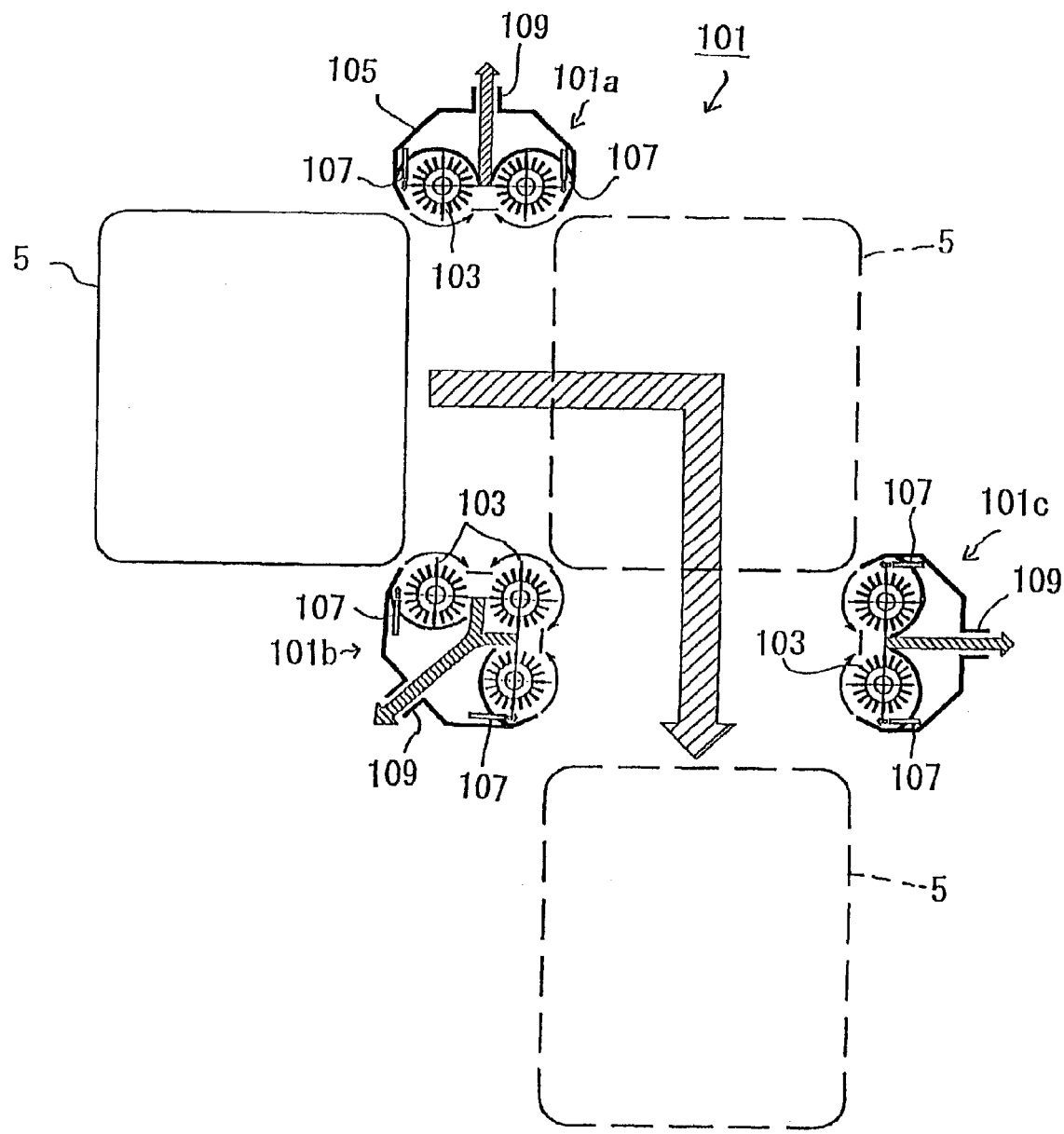
FIG. 9 illustrates operations for cleaning a side of the lid separated from the container.

Within this booth 65 (refer to FIG. 6) is provided a lid's side cleaning unit 101. This lid's side cleaning unit 101 is composed of, as shown in FIG. 9, three units 101a, 101b and 101c, which are disposed to form an L-shaped spatial arrangement as a whole. Each of the units 101a to 101c has a plurality of rotatable dry nylon brushes 103, a brush cover 105, air nozzles 107 each spraying ionizing air from by an end of the brush cover 105, and an exhaust duct 109 exhausting air from inside the brush cover 105. The units 111a, 101b and 101c are disposed, in the lateral direction, at intervals equal to the lateral size of the lid 5 and, in the longitudinal direction, at intervals equal to the longitudinal size of the lid 5.

(Lid's Inside Cleaning Booth)

Figure 10:
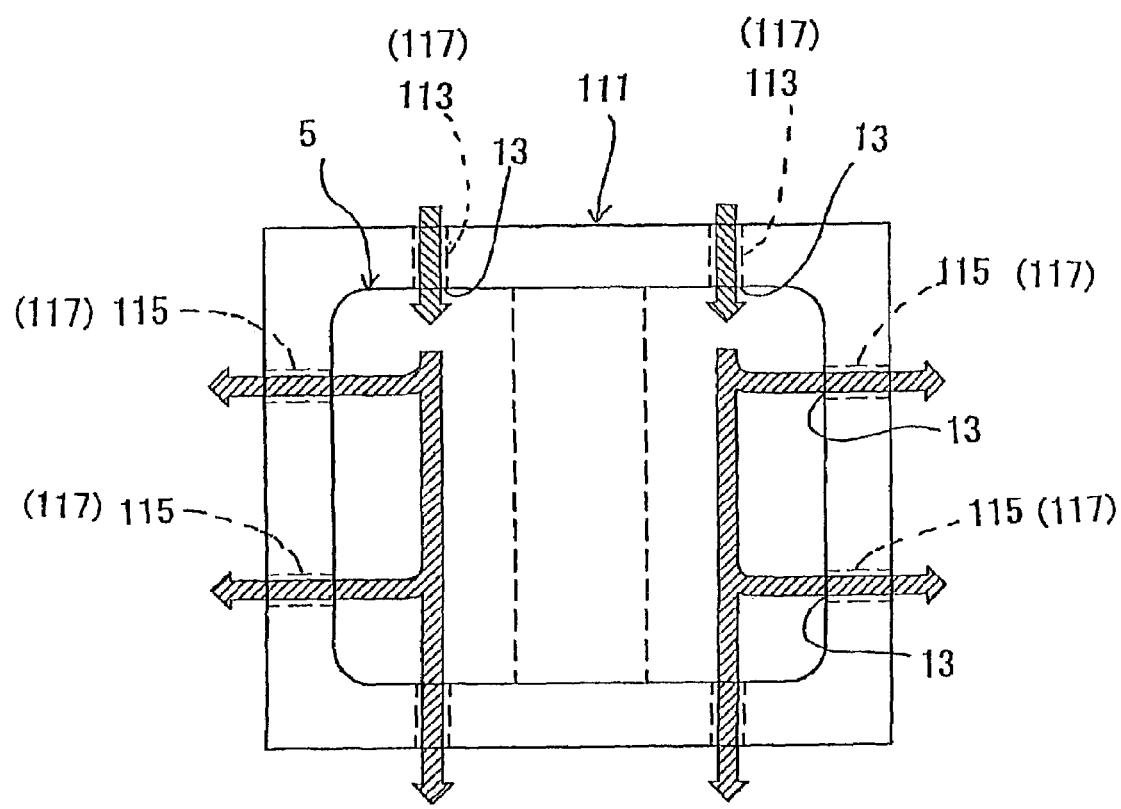
FIG. 10 illustrates operations for cleaning the inside of the lid.

Within the booth 67 (refer to FIG. 5), a lid's inside cleaning block 111 is disposed. As shown in FIG. 10, this lid's inside cleaning block 111 is equipped with air nozzles 113 and exhausting ducts 115. The air nozzles 113 are arranged so that, with the block 111 loaded with the lid 5, the ionizing air is blown from the windows 13, into and from which the locking claws 15 of the lid 5 are allowed to proceed or pull back. The exhausting ducts 115 are arranged, with the block 111 loaded with the lid 5, to eject the ionizing air from the remaining windows 13.

In order to sustain the loaded lid 5 by the use of the locking claws 15 during a period of time required for mutual replacement between the first and second lid opening/closing units 79 and 99, engaging members 117 are formed on the lid's inside cleaning bock 111. Because the engaging members 117 are identical in construction to the engaging members 17 formed on the opening 3 of the lid 5, the locking claws are able to engage with the engaging members 117.

(Lid's Inner-Surface Cleaning Booth)

Figure 11:
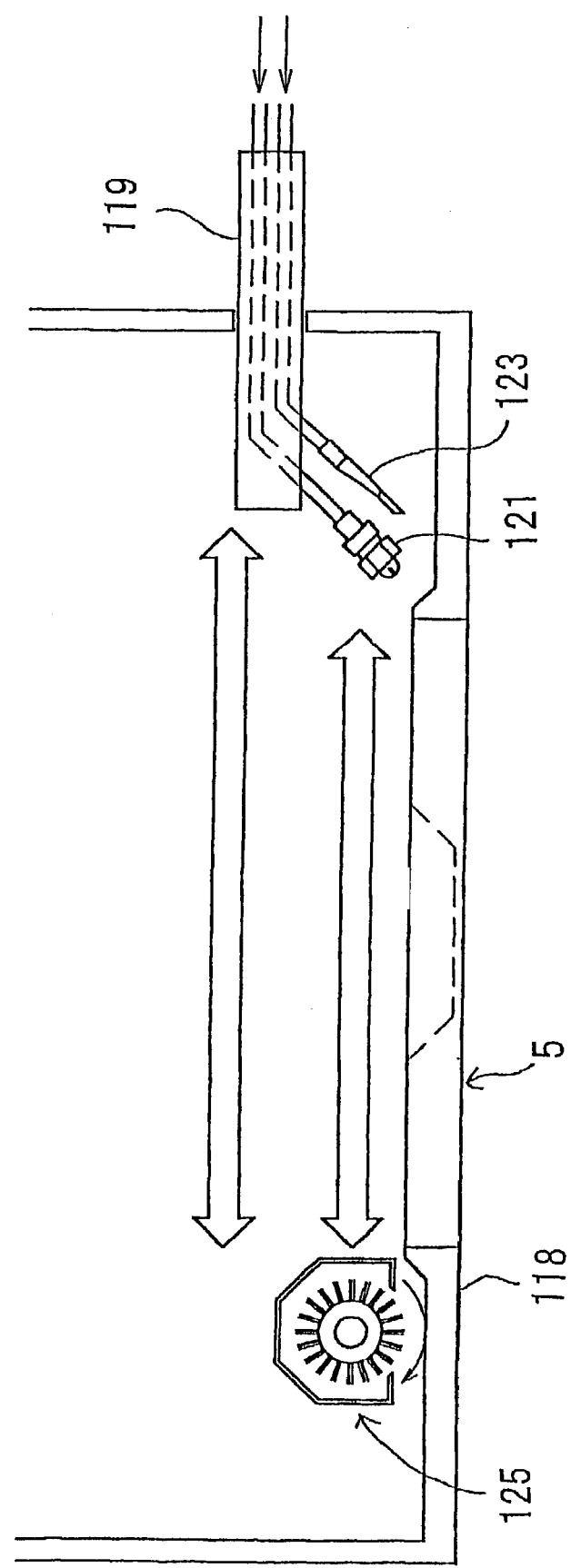
FIG. 11 illustrates operations for cleaning the inner surfaces of the lid.

This lid's inner-surface cleaning booth 69 (refer to FIG. 7) includes, in addition to a securing mechanism 118 to secure the lid 5, a spray nozzle 121, an air knife 123 and cleaning brush 125. As shown in FIG. 11, the spray nozzle 121 is attached to an arm 119 movable along the inner surface of the lid 5 secured by the mechanism 118. The air knife 123 is also attached to the arm 119 and is responsible for ejecting $N_2$ hot air. The cleaning brush 125 is rotatable to move along the inner surface of the lid 5, independently of the arm 119. Although not shown, a second air nozzle is provided to eject $N_2$ hot air toward the entire lid 5 for drying it.

(Container-Body Carrying Means)

Container-body carrying means includes a first carrying unit 127 (refer to FIG. 5), a second carrying unit 129 (refer to FIG. 7), and a third carrying unit 131 (refer to FIG. 5). The first carrying unit 127 carries linearly the container body 1a from the separation booth 63 to the container-body cleaning booth 73. The second carrying unit 129 is in charge of linearly carrying the container body 1a from the container-body cleaning booth 73 to the container-body drying booth 75. Further, the third carrying unit 131 is configured to linearly carry the container body 1a from the container-body drying booth 75 to the coupling booth 71. Of these, each of the first and third carrying unit 127 and 131 is provided with a rotation arm 133 to rotate the container body 1a so as to orient its opening 3 downward or full-face as getting back to the original attitude.

(Container-Body Cleaning Booth)

The container-body cleaning booth 73 (refer to FIGS. 5 and 6) is equipped with a container-body base 135 to chuck the container body 1a as the opening thereof is oriented downward. The container-body base 135 is provided with a chuck device and a cleaning hole located at the center of the base. The cleaning hole is formed so as to be identical in construction to the opening of the container body 1a. At the edge of the clearing hole are provided edge-dedicated cleaning nozzles (not shown) for cleaning the edge around the opening 3 of the container body 1a. Additionally, an elevator apparatus 137 for elevating the container-body base 135 is placed in the booth 73. Furthermore, at a side of the container-body base 135 are provided a cleaning cover 139 and a rotation mechanism 139a, both of which are responsible for closing the container-body booth 73 by covering the container body 1a through a rotation of the cover 139.

Below the container-body base 135, there are provided an inner-surface nozzle 141 for conducting water with high-pressure water and a cleaning brush 143 that is rotatable.

Both of the nozzle 141 and the brush 143 are arranged to be moved laterally by means of a moving mechanism 142 (refer to FIG. 5). Though not shown, another nozzle to spray high-pressure pure water is attached to the cleaning brush 143. On the other hand, above the container-body base 135, an outer-surface nozzle 144 (refer to FIG. 5) is arranged to conduct cleaning with high-pressure water.

Furthermore, both of a switching valve and a hose, though not shown, are connected to each of the not-shown nozzle and the inner-surface nozzle 141 so that spraying the high-pressure pure water can be switched to spaying $N_2$ hot air.

(Container-Body Drying Booth)

This container-body drying booth 75 is provided with a rotable table 145 on which the container body 1a is secured with its front down. A cylindrical drying cover 147 is placed around the table 145 so that the cover 147 can be lifted up or down. Another nozzle (not shown) to spray $N_2$ hot air is arranged at each of the table 145 and at a particular position above the table.

(Coupling Booth)

The coupling booth 71 (refer to FIGS. 5 and 7) is equipped with coupling means for coupling the lid 5 and the container body 1a to each other, which is composed of the foregoing second lid opening/closing unit 99. Within this booth 71 is arranged a not-shown nozzle to spray ionizing air in order to remove electric charges from the entire container.

FIG. 5 still shows a tank 149 for preserving cleaning pure water and a pump 151 for converting pure water to highly pressured water.

[Operations]

(Outlined Operations)

As shown in FIG. 5, the container 1 is carried into the housing 23 of the cleaning apparatus 21 by way of the carrying-in opening 25 with the aid of the loader 27. At the separation booth 53 also serving as the lid's outer-surface cleaning booth 61, the outer surface of the lid 5 is cleaned, which is then followed by separation of the lid 5 from the container body 1a. The separated lid 5 is carried in turn from the booth 63, to the lid's side cleaning booth 65 (refer to FIG. 6), to the lid's inside cleaning booth 67, and to the lid's inner-surface cleaning booth 69 (refer to FIG. 7). In each of the booths, the lid 5 is subject to cleaning and drying carried out with blown hot air.

The container body 1a is carried from the separation booth 63 to the container-body cleaning booth 73, during the time of carriage when the container body 1a is rotated so that the opening 3 thereof faces downward (refer to FIG. 6). In the booth 73, the container body 1a is subject to cleaning. The container body 1a is then carried, still facing downward, into the container-body drying booth 75, where the container body 1a undergoes a drying process.

Both of the lid 5 and the container body 1a, which have been carried into the coupling booth 71, are coupled to each other. The coupled container 1 is carried out from the housing 23 of the cleaning apparatus 21 by way of the carrying-out opening 29 with the aid of the unloader 31.

Each operation will now be explained in detail.

(Carrying-in)

The container 1 is placed on the loader 27 (refer to FIGS. 5 and 6) arranged on the frontal left portion of the housing of the cleaning apparatus 21. During the period of this placement, the three pin grooves formed on the bottom of the container 1 are engaged with the three pins of the loader 27, and the container 1 is positioned. The opening/closing shutter 33 at the carrying-in opening 25 facing the loader 27 is opened, and the container 1 is delivered by the carrying-in unit 27a into the separation booth 63 also serving as the lid's outer-surface cleaning booth 61.

After the carrying-in unit 27a has returned to its initial position, the opening/closing shutter 33 is closed.

(Cleaning of Lid's Outer Surface)

In the lid's outer-surface cleaning booth 61 (refer to FIGS. 5 and 6), the outer surface of the lid 5 is cleaned. The lid's outer-surface cleaning unit 77, which is in charge of this cleaning, waits at the frontal center within the housing 23 when the cleaning is not carried out. When the cleaning is required, the unit 77 is moved in a sliding manner along the outer surface of the lid 5 of the container 1 located at the frontward left within the housing 23. During the period of this sliding movement, the rotatable dry nylon brush 85 supported by the sliding arm comes into contact with the outer surface of the lid 5. Concurrently with this contact, the ionizing air is sprayed from the tip of the dry nylon brush 85, and then exhausted through the inside of the brush cover 87.

(Separation of Lid from Container Body)

As soon as the outer surface of the lid 5 has been cleaned, the first lid opening/closing unit 79 functioning as separation means rises from a lower position in the separation booth 65 also serving as the lid's outer-surface cleaning booth 61 (refer to FIGS. 5 and 6). The unit 79 that has risen sustains the lid 5 to separate it from the container body 1a.

(Cleaning of Side of Lid)

The first lid opening/closing unit 79, which has continuously sustained the lid 5, moves the lid 5 into the lid's side cleaning booth 65 (refer to FIG. 6) located below, during which the lid 5 is made to pass through the lid's side cleaning unit 101. Practically, between the two of the three units 111a, 101b, and 101c (refer to FIG. 9) located along an L-shaped arrangement, which compose the lid's side cleaning unit 101, the lid 5 is forced to first move downward, then move leftward, so as to trace a reversed L-shape movement path. As soon as the rotating dry nylon brushes 103 of each unit come in contact to a side surface of the lid 5, ionizing air is ejected from the tip of each dry nylon brush 103, and then expelled from the inside of the brush cover 105. The downward travel of the lid 5 allows both of the right and left side surfaces thereof to be cleaned. The leftward travel of the lid 5, which follows the downward travel, makes it possible to clean both of the upper and lower side surfaces of the lid 5.

(Cleaning of Inside of Lid)

The first lid opening/closing unit 79, which has still sustained the lid 5, forcibly fits the lid 5 into the lid's inside cleaning bock 111 disposed in the lid's inside cleaning booth 67 (refer to FIG. 5) located at the center within the housing. After this fitting, as shown in FIG. 10, the air nozzles 113 are used to blow ionizing air into the block 111 through its windows 13, into or from which the locking claws are inserted or pulled back. The air that has been blown into the block 111 is then expelled out through the exhausting ducts 115 from the remaining windows 13.

(Switching Between First and Second Lid Opening/Closing Units)

After completion of the cleaning by means of the ionizing air, the opening/closing units are switched over from the first lid opening/closing unit 79 to the second opening/closing unit 99 (refer to FIG. 5). Specifically, the lid 5 that has sustained and simply been fit into the lid's inside cleaning block 111 (refer to FIG. 10) by the first lid opening/closing unit 79 is caused to a second state where the lid 5 is loaded to the block 111. This loading is carried out such that keys of a mechanism similar to an opener mechanism equipped with the first lid opening/closing unit 79 are inserted into the key holes 11 of the lid 5 (refer to FIG. 5) and rotated therein. This will cause the locking mechanism installed within the lid 5 to be driven, resulting in that the locking claws 15 protrude into the four windows 13. Hence the locking claws engage with the engaging members 117 (also serving as the air nozzles 113 and the exhausting ducts 115) of the lid's inside cleaning block 111. Then the first lid opening/closing unit 79 is returned to the separation booth 63. The second lid opening/closing unit 99 then returns from the lid's inner-surface cleaning booth 69, removes the lid 5 that has been loaded to the lid's inside cleaning block 111, and delivers the lid 5 to the lid's inner-surface cleaning booth 69 located at the frontward right within the housing 23.

(Cleaning of Inner Surface of Lid)

The second lid opening/closing unit 99 secures the lid 5 to the securing mechanism 118 in the lid's inner-surface cleaning booth 69 (refer to FIG. 7). After securing the lid 5, high-pressure water is sprayed from the spray nozzle 121 secured on the arm 119 movable along the inner surface of the lid 5, which is shown in FIG. 11. Then, while the cleaning brush is rotated, the high-pressure water is sprayed, with the spray nozzle 121 also moved. Spraying the high-pressure water is followed by spraying ultrapure water from the splay nozzle 121. Finally, $N_2$ hot air is blown from the air knife 123 secured to the arm 119, so that this blowing will dry up the lid 5.

(Blowing Hot Air to Lid)

After finishing cleaning the inner surface of the lid, it is required for the lid to be kept in the lid's inner-surface cleaning booth 69 until the container body 1a is cleaned and dried up. During such waiting period of time, $N_2$ hot air is sprayed toward the whole lid 5 for drying it.

(Downward Turn of Container Body)

On the other hand, the gripper 19 of the container body that has been separated from the lid 5 is gripped by the first carrying unit 127. The container body 1a is lifted and turned so as to face its opening 3 downward (refer to FIG. 6).

(Cleaning of Container Body)

Figure 12:
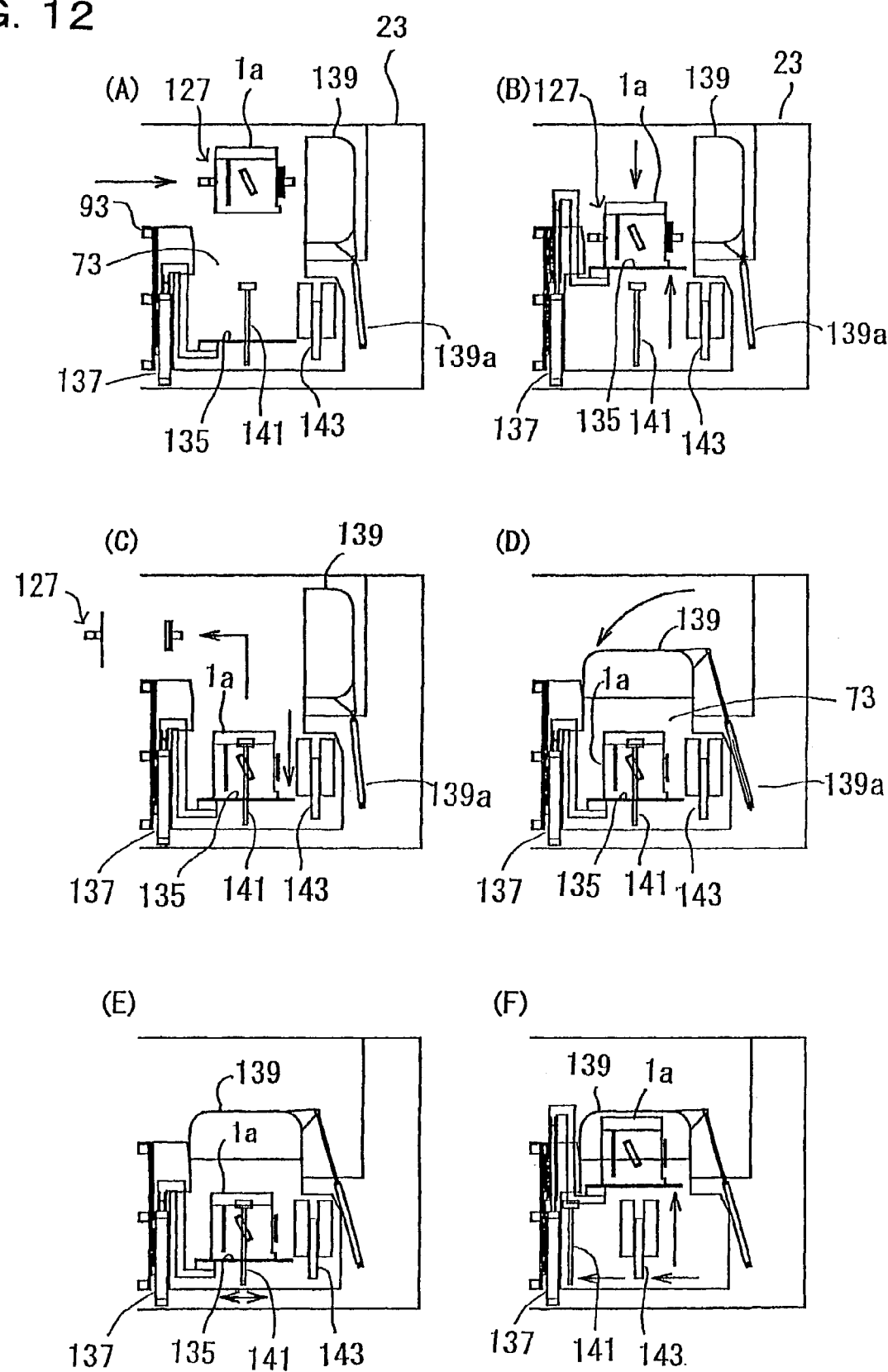
FIG. 12 illustrates cleaning steps (A) to (F) carried out in this order within a container-body cleaning booth shown at the left of the cleaning apparatus shown in FIG. 7.
Figure 13:
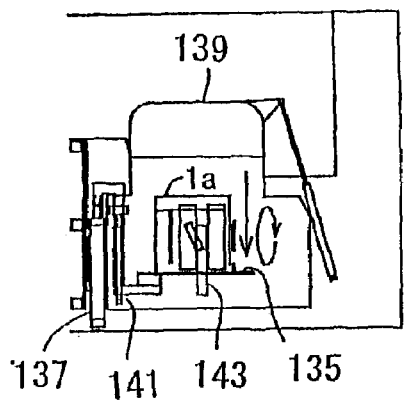
FIG. 13 illustrates cleaning steps (G) to (L) carried out in this order, which are shown additionally to the steps shown in FIG. 12.
Figure 13:
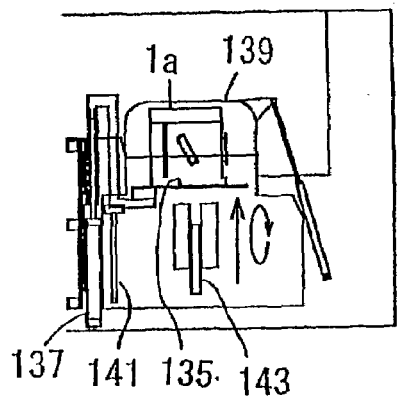
Figure 13:
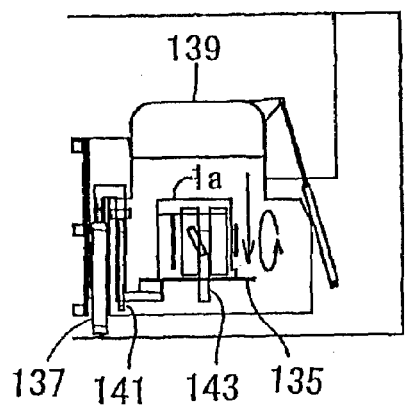
Figure 13:
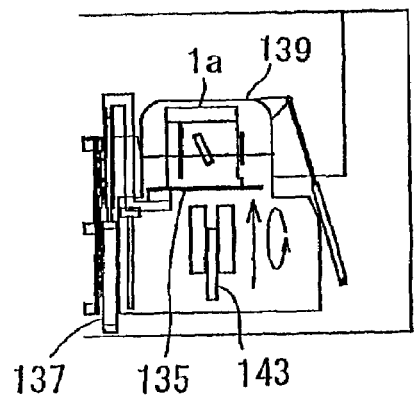
Figure 13:
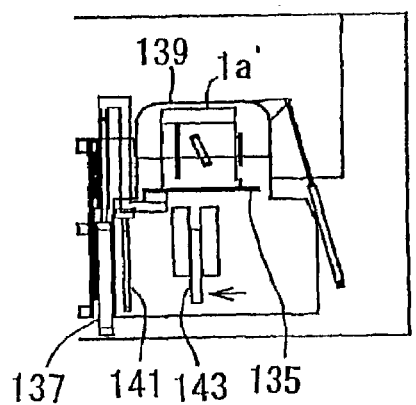
Figure 13:
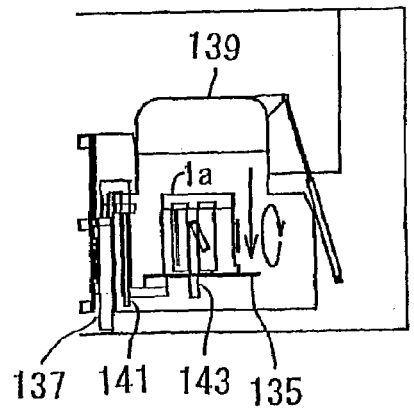
Figure 14:
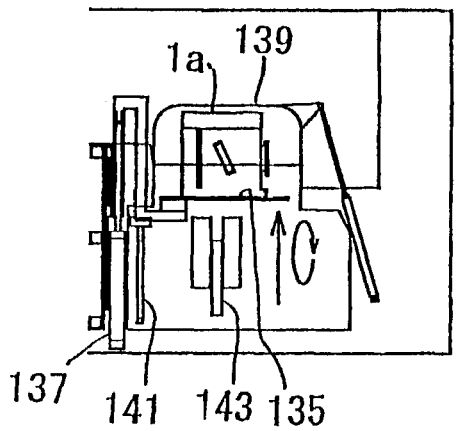
FIG. 14 illustrates cleaning steps (M) to (R) carried out in this order, which are shown additionally to the steps shown in FIG. 13.
Figure 14:
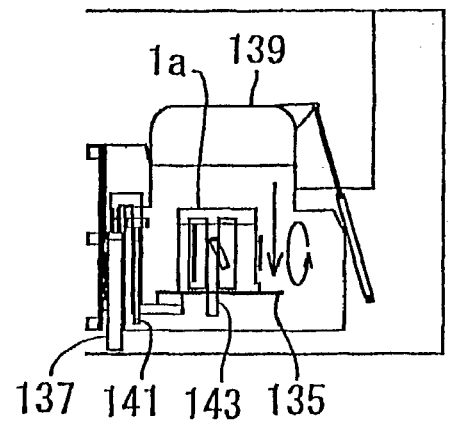
Figure 14:
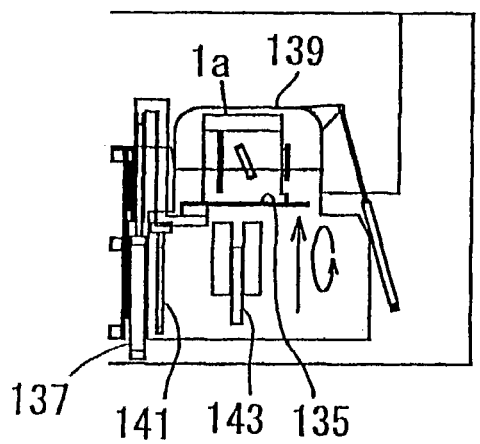
Figure 14:
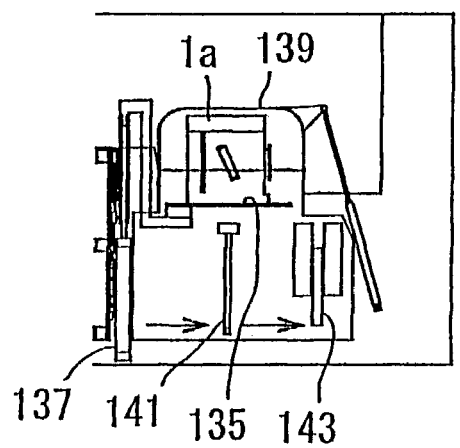
Figure 14:
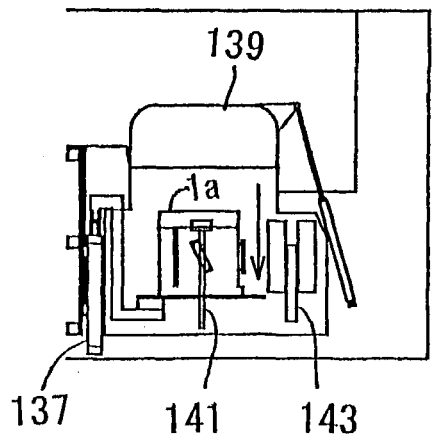
Figure 14:
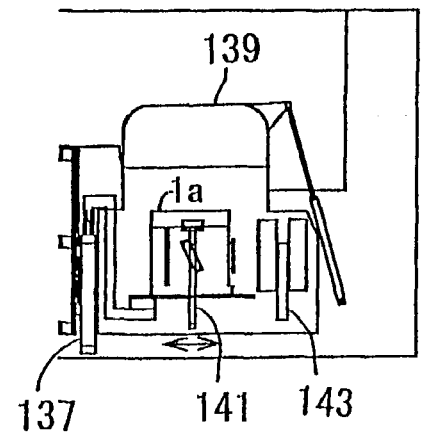

With the turned attitude of the container body 1a maintained, the container body 1a is carried into the container-body cleaning booth 73 (refer to FIGS. 5 and 6) (refer to FIG. 12 (A)). And the container body 1a is laid on the container-body base 135 that has been raised up by the elevator apparatus 137, with the front of the container body 1a downward, and is chucked (refer to FIG. 12 (B)). The cleaning hole at the center of the container-body base 135 is made to coincide, in position, with the opening of the container body 1a. The first carrying unit 127 returns to the separation booth 63, and the container-body base 135 is lowered (FIG. 12(C)). The cleaning cover 139 is turned to cover the container body 1a, so that the container-body cleaning booth 73 is closed (FIG. 12 (D)).

First of all, the container body 1a is cleaned with the use of high-pressure water. Both of the inner-surface nozzle 141 and the outer-surface nozzle 144 (refer to FIG. 5) are moved while those nozzles spray high-pressure pure water, thereby the inner and outer surfaces of the bottom of the container body 1a being cleaned (FIG. 12 (E)). This spray is kept continuing while the container body 1a is raised together with the container-body base 135, in such a manner that the inner and outer surfaces of the sides of the container body 1a are cleaned as well. As soon as this rise is completed, the inner-surface nozzle 141 is moved laterally, whilst the cleaning brush 143 is moved to the center, so that both of the nozzle 141 and the brush 143 are changed over with each other. During the period of the lateral travel of the inner-surface nozzle 141, the foregoing spray is also continued to clean the edge of the opening 3 of the container body 1a (refer to FIG. 12 (F)).

The container body 1a will then undergo cleaning with the aid of brushes. To be specific, the container body 1a is lowered together with the container-body base 135, during the time when the cleaning brush 143 is rotated so as to clean the longitudinal portions of the teeth 9 (refer to FIG. 2) disposed inside the container body 1a. The outer-surface nozzle 144 (refer to FIG. 5) has still been kept spraying the high-pressure pure water. After completing the lowing action of the container body 1a, the cleaning brush 143 is rotated, during the time when the high pressure pure water is sprayed from the cleaning brush 143, which allows the back sides of the teeth 9 to be cleaned (refer to FIG. 13 (G)). With the rotation of the cleaning brush 143 maintained, the container body 1a is raised together with the container-body base 135 (refer to FIG. 13 (H)). The container body 1a is repeatedly lowered and raised, each of the lowering and raising operations requiring that the cleaning brush 143 be rotated in reverse (refer to FIG. 13 (I, J)). While the cleaning brush 143 is further offset in its lateral position, the container body 1a is repeatedly lowered and raised (refer to FIG. 13 (K, L)), with the rotation of the cleaning brush 143 controlled in reverse responsively to each of the lowering and raising operations (refer to FIG. 14 (M, N)).

A finishing cleaning operation will then follow. Specifically, after the completion of the rise of the container body 1a (refer to FIG. 14 (O)), the inner-surface nozzle 141 is moved to the center and the cleaning brush 143 is laterally moved, so that both of the nozzle 141 and the brush 143 are changed over with each other. During those switchover operations, the cleaning brush 143 is rotated and the inner-surface nozzle 141 is engaged in the spray, so that the edge of the opening 3 of the container body 1a is cleaned in a finishing manner (refer to FIG. 14 (P)). As the container body 1a is gradually lowered (refer to FIG. 14 (Q)), both of the inner-surface nozzle 141 and the outer-surface nozzle 144 (refer to FIG. 5) are operated to spray high-pressure pure water, so that the side portions of the inner and outer surfaces of the container body 1a are cleaned in a finishing manner. After having completed the lowering operation of the container body 1a, both of the outer-surface nozzle 144 and the inner-surface nozzle 141 that laterally moves are used for cleaning the bottoms of the inner and outer surfaces of the container body 1a in a finishing manner (refer to FIG. 14 (R)). Then, both of the outer-surface nozzle 144 and the inner-surface nozzle 141 are used to spray $N_2$ hot air to dry the bottoms of the inner and outer surfaces. Moreover, as the container body 1a is made to rise gradually, the $N_2$ hot air is kept spraying so as to dry up the side portions of the inner and outer surfaces (refer to FIG. 15 (S)). After having dried up the container body 1a sufficiently, the cleaning cover 139 is turned toward its initial position, and then the container-body cleaning booth is opened (refer to FIG. 15 (T)).

(Drying Container Body)

Figure 15:
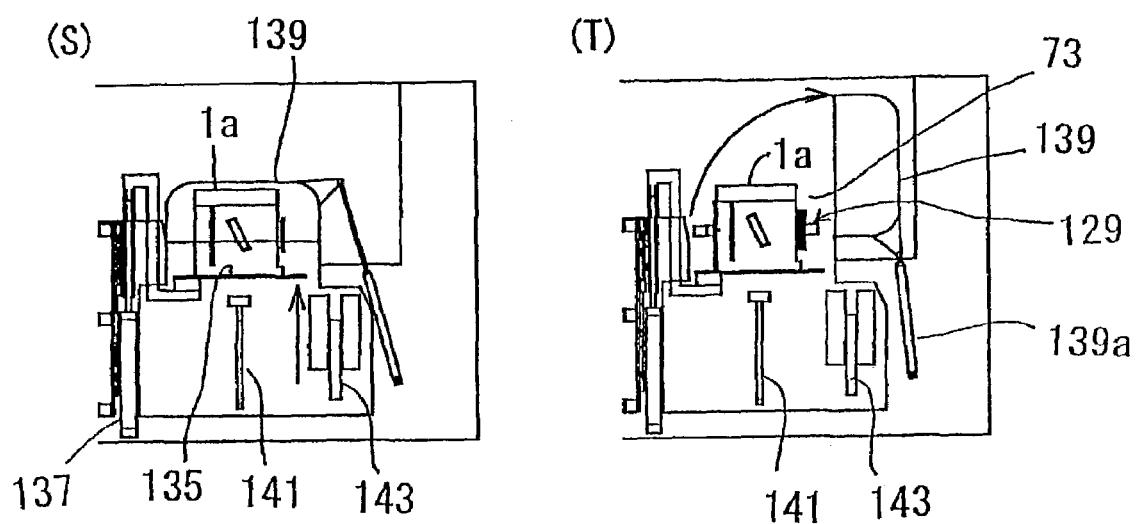
FIG. 15 illustrates cleaning steps (S) and (T) carried out in this order, which are shown additionally to the steps shown in FIG. 14.

The container body 1a is gripped by the second carrying unit 129 that has returned from the container-body drying booth 75 (refer to FIG. 15 (T)). In this booth 75, the container-body base 135 is released from being chucked, lifted up for delivery into the container-body drying booth 75, and laid on the table 145 arranged in the booth 75. The second carrying unit 129 is then made to return. The cylindrical drying cover 147 is raised so as to cover the sides of the container body 1a (refer to FIG. 6). The table 145 is then rotated, and $N_2$ hot air is sprayed toward the container body 1a under rotation for drying it. When the drying operation is finished, the table 145 is halted at a given rotating position and subjected to positioning, before the drying cover 147 is lowered.

(Coupling Between Container Body and Lid)

The container body 1a, which has been dried up, is gripped by the third carrying unit 131 that has returned from the coupling booth 71, and then delivered from the container-body drying booth 75 to the coupling booth 71. In this booth 71, the container body 1a is rotated so as to keep its opening 3 front, and then lowered down to a predetermined coupling position, at which positioning is made based on kinematics coupling.

Meanwhile, the lid 5 that had been dried up is driven by the second lid opening/closing unit 99 to be lifted from the lid's inner-surface cleaning booth 69 up to the coupling position in the coupling booth 71.

At the coupling position, the second lid opening/closing unit 99 operates to couple the container body 1a and the lid 5 to each other, and ionizing air is sprayed toward those coupled members to remove electric charges from the entire members.

(Carrying-out)

After the removal of electric charges, the opening/closing shutter 33 at the carrying-out opening 29 is opened to carry out the container 1 via the carrying-out opening 29 with the aid of the carrying-out unit 31a. The container 1 that has been carried out is laid on the unloader 31 located at the carrying-out opening 29, and then the opening/closing shutter 33 is closed.

[Operations and Advantages]

The foregoing embodiment is able to provide the following operations and advantages.

It is enough for a worker to place a container 1 to be cleaned on the loader 27 of the cleaning apparatus 21. The container 1 is then automatically carried into the cleaning apparatus 21, separated into its container body 1a and its lid 5, and subject to cleaning and drying thereof. Both of the container body 1a and the lid 5 that have been cleaned and dried are automatically re-coupled to each other, and carried out from the cleaning apparatus 21 onto the unloader 31. Thus it is unnecessary that the inside of the container 1 is exposed to lower-clean-level air existing outside the cleaning apparatus 21. In addition, the conventional re-coupling operation manually performed by a worker is not necessary. It can therefore be avoided that the inside of the container 1 that has already been cleaned once is degraded with regard to its clean level. The cleaning apparatus 21 can be installed in either a highly cleaned room or a lower-clean-level room and can be driven based on either worker's manual operations or automatic operations done by a robot.

The container body 1 and the lid 5, after the separation, are individually delivered for the cleaning and drying processes carried out in parallel with each other, thus speeding up the entire cleaning process.

Further, both of the first and second lid opening/closing units 79 and 99 can slidably be moved to carry the lid 5, thereby allowing the units 79 and 99 to be uses as the separation means, coupling means, and lid carrying means. This eliminates the necessity of arranging additional lid carrying means.

OTHER EMBODIMENTS

The foregoing embodiment has been described about the configuration in which the separation booth 63 is used in common for the lid's outer-surface cleaning booth 61. Instead of this, there may be provided another embodiment in which both booths 61 and 63 are formed separately from each other.

Further, the foregoing embodiment has been described such that the container-body carrying means is composed of the first, second and third carrying units 127, 129 and 131. However, the container-body carrying means may be realized by a single robot in other embodiments.

In the foregoing embodiment, the lid cleaning booth is made up of four booths consisting of the lid's outer-surface cleaning booth 61, lid's side cleaning booth 65, lid's inside cleaning booth 67, and lid's inner-surface cleaning booth 69. Another embodiment, the number of booths are not limited to four, but the lid cleaning booth can be formed by one, two, three, or, five or more booths.

Moreover, the foregoing embodiment has been constructed such that to blow $N_2$ hot air for drying is carried out after the cleaning performed by the use of water. There can be provided another embodiment in which the way of drying is replaced by a drying technique using a centrifugal force.

In the foregoing embodiment, the cleaning has been carried out by the use of pure water. Alternatively, it is possible to provide other embodiments, where chemicals, such as volatile chlorofluorocarbon alternative chemical, are used. In such a case, the process of drying can be omitted from the cleaning processes.

Further, the foregoing embodiment has been configured to adopt both of the carrying-in and carrying-out openings 25 and 29, but this is not always a definitive list. For example, there may be provided another embodiment in which a single carrying-in/carrying-out opening is formed and the separation means is made to serve as the coupling means as well.

Although, in the case of the foregoing embodiment, the separated container body 1a and lid 5 are subjected to cleaning processes at mutually separate booths, but there is a further modification that the separated container body 1a and lid 5 are cleaned at the same booth. In this case, the carrying means can be simplified.

Furthermore, the foregoing embodiment has adopted the housing 23 whose inside is highly cleaned and that contains the foregoing various means, but this configuration can be modified as well. As long as each means is installed inside a highly cleaned room, the above configuration can be changed into various ways.

INDUSTRIAL APPLICABILITY

As described above, the present invention permits the separation means to separate the container into its container body and its lid. Both of the container body and the lid are cleaned by the individual cleaning means, and re-coupled to each other by the coupling means. Because the separated container body and lid are not left as they are but always re-coupled to each other after the cleaning of each member, the inside of the container that has been cleaned will not degraded as to its the clean level. In addition, there is no necessity to provide a system to purify a worker, who is engaged in the coupling operation, by removing dusts from the worker.

The dust-free objects to be contained and carried in and by the container according to the present invention thereof are not confined to semiconductor wafers. Various other objects, such as semiconductor substrates (including liquid crystal substrates) and members used for medical treatment, can be contained into the container.

What is claimed is:

1. A cleaning apparatus contained in a high cleanness housing for cleaning an inside and outside of a container containing a dust-free object for carrying, the apparatus comprising:
loading means to load the container with a lid into a carrying-in opening of the housing in a horizontal direction, while keeping the lid in a vertical position;
separating means for separating the container into a container body and the lid;
cleaning means for cleaning the separated container body and lid separately, wherein each of the cleaning means is disposed in each separated booth defined in the housing;
coupling means for coupling again the cleaned container body and lids; and
transporting means for returning the container body coupled with the lid to a carrying-out opening, while keeping the lid in the vertical position.

2. The cleaning apparatus according to claim 1, wherein each of the separating, cleaning, and coupling means is disposed within a clean room kept at a higher clean level.

3. The cleaning apparatus according to claim 1, wherein each of the separating, cleaning, and coupling means is disposed within the housing equipped with the openable and closable carrying-out/in opening for carrying out or in the container and kept at a higher clean level.

4. The cleaning apparatus according to claim 3, wherein the cleaning means comprising
container-body cleaning means and lid cleaning means disposed separately from each other, in which each of both the cleaning means is installed in individual cleaning booths partitioned within the housing, and
carrying means for carrying the separated container body or the separated lid to each of the cleaning booths as well as from each of the cleaning booths after the cleaning.

5. The cleaning apparatus according to claim 1, wherein the cleaning means comprises either one means or a plurality of means selected from a group of means of spraying gas, spraying a chemical, spraying water, and rotating a brush, a plurality of selected means being combined with each other.

6. The cleaning apparatus according to claim 1, wherein the cleaning means is composed of means for spraying water, and the apparatus further comprising dry means that perform a drying action after the cleaning.

7. The cleaning apparatus according to claim 1, wherein the cleaning apparatus comprises two respective cleaning apparatuses, being disposed in a separate booth, for the container and the lid, which are transported to the booths and cleaned there, and transported to the carrying-out opening through which the container is carried out from the housing.

8. The cleaning apparatus according to any of claims 1, wherein the cleaning means further comprises dry means that performs drying the container body and the lid after the cleaning.

9. A cleaning apparatus for cleaning an inside and outside of a container containing a dust-free object for carrying, the apparatus comprising:
(a) a housing having a plurality of partitioned booths closable in a shielded manner which are kept in a higher clean level;
(b) a carrying-in opening through which the container is carried in the housing and a carrying-out opening through which the container is carried out from the housing in an opposite direction of the carrying-in direction, the carrying-in and carrying-out openings being formed on a wall of the housing;
(c) opening and closing shutters arranged at the carrying-in and carrying-out openings, respectively;
(d) loaders or unloaders for locating the container, the loaders or unloaders being disposed on an outside of both the carrying-in and carrying-out openings, respectively;
(e) outer-surface cleaning means, which is disposed in a separation booth located on an inner side of the carrying-in opening, for cleaning an outer surface of the container before being separated and separation means for separating the container into a container body and a lid;
(f) container-body cleaning means disposed in a container-body cleaning booth next to the separation booth;
(g) container-body drying means disposed in a container-body drying booth next to the container-body cleaning booth;
(h) coupling means for re-coupling both of the container body and the lid to each other, the coupling means being disposed in a coupling booth next to the container-body drying booth and directly leading to the carrying-out opening;
(i) container-body carrying means for carrying the container body from the loader, the separation booth, the container-body cleaning booth, the container-body drying booth, and to the coupling booth;
(j) lid cleaning means and lid drying means both disposed in a lid cleaning booth next to the separation booth; and
(k) lid carrying means for carrying the lid, together with the separation means that is engaged in the separation, from the separation booth, the lid cleaning booth, and to the coupling booth.

* * * * *